(12) United States Patent
Okabe

(10) Patent No.: US 8,413,693 B2
(45) Date of Patent: *Apr. 9, 2013

(54) LID OPENING/CLOSING SYSTEM OF AN AIRTIGHT CONTAINER

(75) Inventor: Tsutomu Okabe, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/529,406

(22) Filed: Jun. 21, 2012

(65) Prior Publication Data

US 2012/0261031 A1 Oct. 18, 2012

Related U.S. Application Data

(60) Continuation of application No. 13/300,201, filed on Nov. 18, 2011, which is a division of application No. 12/773,368, filed on May 4, 2010, now Pat. No. 8,082,955, which is a continuation of application No. 11/563,869, filed on Nov. 28, 2006, now Pat. No. 7,841,371.

(30) Foreign Application Priority Data

Nov. 30, 2005 (JP) ................................. 2005-346083
Nov. 21, 2006 (JP) ................................. 2006-314202

(51) Int. Cl.
B65G 1/12 (2006.01)
B65B 31/04 (2006.01)

(52) U.S. Cl. .............. 141/63; 141/51; 141/98; 414/217; 414/411; 414/935; 206/210

(58) Field of Classification Search .................... 141/51, 141/63, 70, 98; 206/710–712; 414/217.1, 414/411, 935

See application file for complete search history.

(56) References Cited

U.S. PATENT DOCUMENTS

| | | |
|---|---|---|
| 5,988,392 A | 11/1999 | Hosoi |
| 6,817,822 B2 | 11/2004 | Tokunaga |
| 6,867,153 B2 | 3/2005 | Tokunaga |
| 6,883,539 B2 | 4/2005 | Inoue et al. |
| 6,926,029 B2 | 8/2005 | Inoue et al. |
| 7,059,849 B2 | 6/2006 | Sakata et al. |
| 7,398,801 B2 | 7/2008 | Lee et al. |
| 7,726,353 B2 | 6/2010 | Okabe |

(Continued)

FOREIGN PATENT DOCUMENTS

| | | |
|---|---|---|
| EP | 1 780 785 A1 | 5/2007 |
| JP | 57-203278 | 12/1982 |

(Continued)

OTHER PUBLICATIONS

Japanese Office Action issued Jun. 16, 2010, in Patent Application No. 2008-045917.

Primary Examiner — Gregory Huson
Assistant Examiner — Nicolas A Arnett
(74) Attorney, Agent, or Firm — Oblon, Spivak, McClelland, Maier & Neustadt, L.L.P.

(57) ABSTRACT

A curtain nozzle is located above an opening portion in a FIMS. A gas curtain formed of inert gas for closing the opening portion is formed. A cover is so provided as to cover a part of the curtain nozzle so as to prevent peripheral gas around an opening of the curtain nozzle from being involved in the gas curtain of the inert gas emitted from the curtain nozzle.

2 Claims, 14 Drawing Sheets

U.S. PATENT DOCUMENTS

| | | |
|---|---|---|
| 7,841,371 B2 | 11/2010 | Okabe |
| 8,082,955 B2 * | 12/2011 | Okabe ............................ 141/51 |
| 2004/0099824 A1 * | 5/2004 | Igarashi et al. .......... 250/559.29 |
| 2004/0152322 A1 * | 8/2004 | Tokunaga .................... 438/689 |
| 2004/0237244 A1 | 12/2004 | Suzuki et al. |
| 2006/0088406 A1 | 4/2006 | Miyajima et al. |
| 2006/0272169 A1 | 12/2006 | Miyajima et al. |
| 2009/0035099 A1 | 2/2009 | Okabe et al. |
| 2009/0035100 A1 | 2/2009 | Okabe et al. |
| 2009/0169342 A1 | 7/2009 | Yoshimura et al. |
| 2010/0133270 A1 | 6/2010 | Okabe et al. |

FOREIGN PATENT DOCUMENTS

| | | |
|---|---|---|
| JP | 6-63934 | 3/1994 |
| JP | 11-145245 | 5/1999 |
| JP | 2003-7799 | 1/2003 |
| JP | 2003-45933 | 2/2003 |
| JP | 2004-235516 | 8/2004 |
| JP | 2004-260172 | 9/2004 |
| TW | 397796 | 7/2000 |
| TW | 522482 | 3/2003 |
| TW | 200601482 | 1/2006 |
| WO | WO 2005/124853 A1 | 12/2005 |

\* cited by examiner

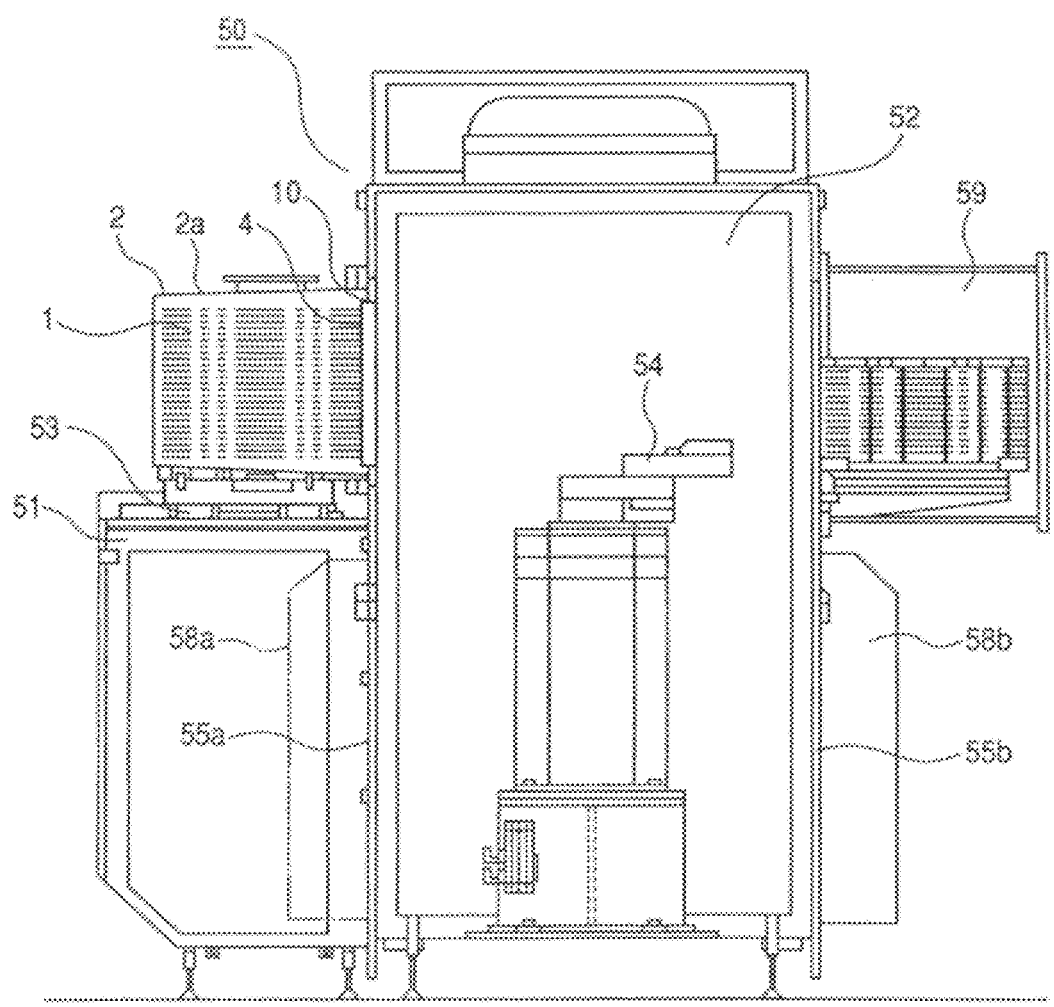

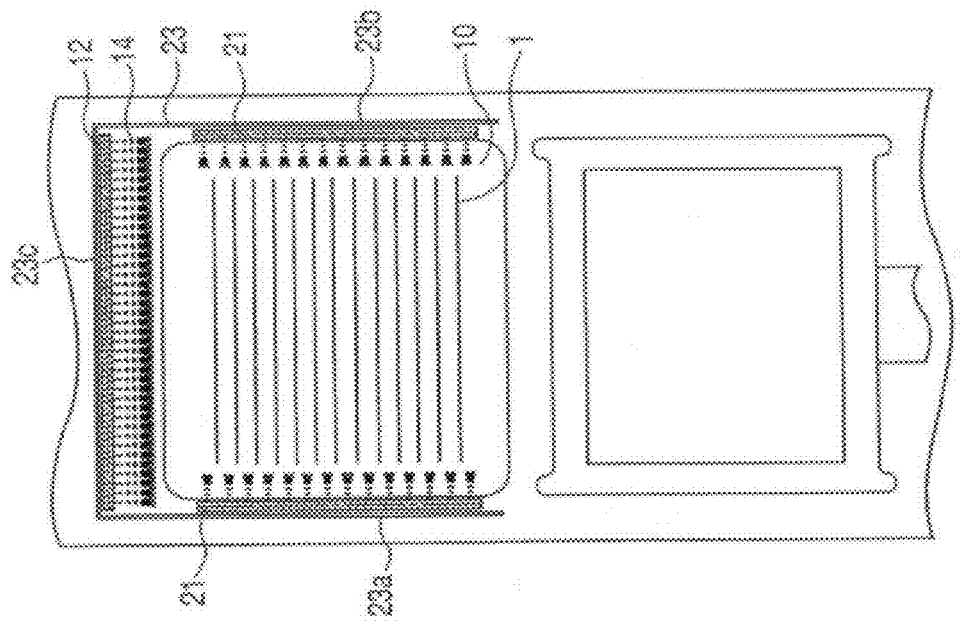
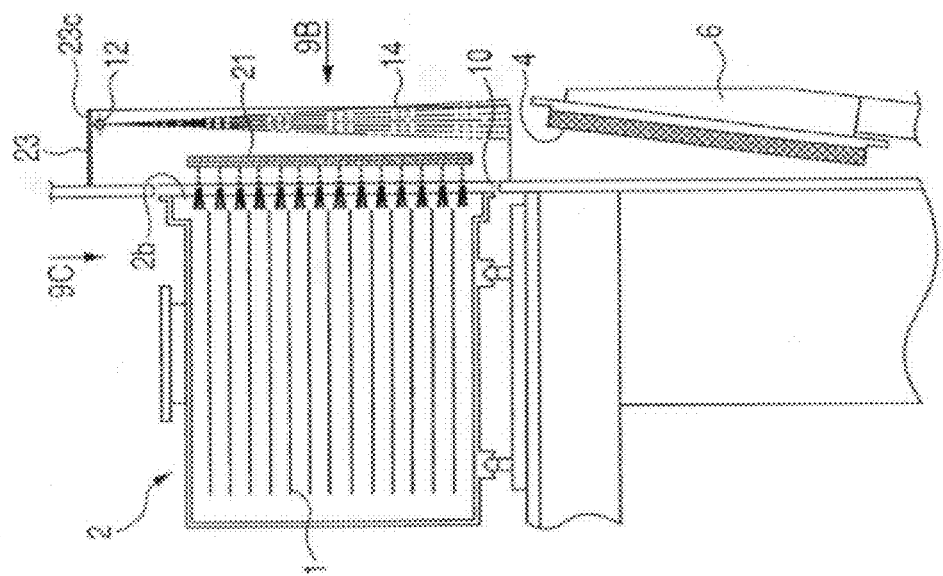

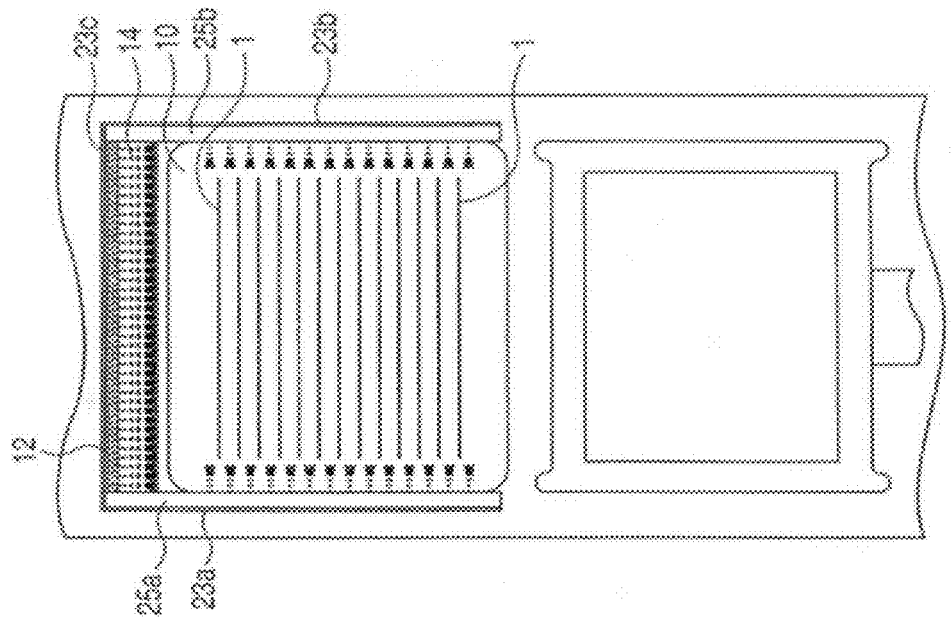
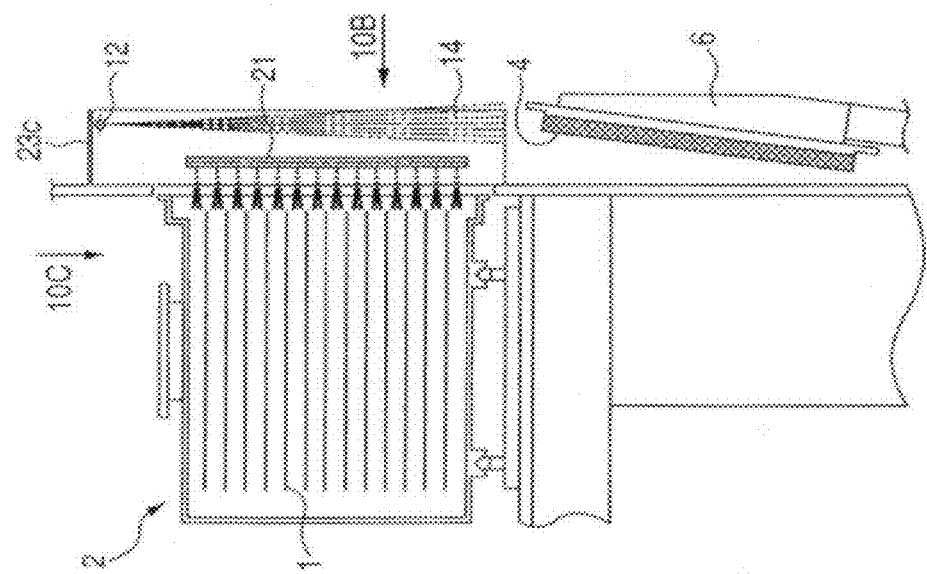

LID OPENING/CLOSING SYSTEM OF AN AIRTIGHT CONTAINER

CROSS-REFERENCE TO RELATED APPLICATIONS

The present application is a Continuation application of Ser. No. 13/300,201 filed Nov. 18, 2011, which is a Divisional application of Ser. No. 12/773,368 filed May 4, 2010, which is a Continuation application of Ser. No. 11/563,869 filed Nov. 28, 2006, the entire contents of which are incorporated herein by reference, and which claims priority from Japanese Applications 2005-346083 filed Nov. 30, 2005 and 2006-314202 filed Nov. 21, 2006.

BACKGROUND OF THE INVENTION

1. Field of the Invention

The present invention relates to a so-called front-opening interface mechanical standard (FIMS) system used when wafers held in a transfer container which is called a pod are transferred among semiconductor processing apparatuses in a semiconductor manufacture process or the like. To be more specific, the present invention relates to a FIMS system which has a purging mechanism for cleaning an inside of the pod and in which the pod serving as an airtight container for containing the wafers, which is called a front-opening unified pod (FOUP), is placed and the wafers are put in and taken out from the pod for transfer of the wafer by opening/closing a lid of the pod, i.e., a lid opening/closing system.

2. Related Background Art

Up to now, a semiconductor manufacture process has been conducted in a so-called clean room in which semiconductor wafers are treated with high cleanliness maintained therein. However, in order to cope with an increase in wafer size and reduce a cost required for maintenance of the clean room, a method of maintaining only the inside of a processing apparatus, the pod (wafer container), and a mini-environment for substrate transfer from the pod to the processing apparatus in a highly clean state is employed in recent years.

The pod includes a main body portion having a substantially box-like shape and a lid. The main body portion includes a rack capable of holding a plurality of wafers therein in a state where the wafers are separated from one another in parallel and an opening which is formed on a surface of the main body portion and is used for putting in/taking out wafers. The opening is closed with the lid. A pod in which the opening is located not on the bottom or top surface but on a side surface thereof (in front of the mini-environment) is generically called a front-opening unified pod (FOUP). The present invention is mainly intended for a structure using the FOUP.

The above-mentioned mini-environment includes a first opening opposed to the opening of the pod, a door for closing the first opening, a second opening provided on a semiconductor processing apparatus side, and a transfer robot that moves from the first opening to the inside of the pod to hold the wafer and passes through the second opening to transfer the wafer to the semiconductor processing apparatus side. A structure for forming the mini-environment includes a mount base for supporting the pod so that the opening of the pod is opposed to the front surface of the door.

A positioning pin inserted into a positioning hole provided on a bottom surface of the pod to regulate a mount position of the pod and a clamp unit engaged with a portion to be clamped which is provided on the bottom surface of the pod to fix the pod onto the mount base are located on an upper surface of the mount base. The mount base is normally movable back and forth with respect to a door direction by a predetermined distance. When the wafers in the pod are to be transferred to the processing apparatus, the pod is moved in a state where the pod is mounted on the mount base until the lid of the pod comes in contact with the door. After that contact, the lid is removed from the opening of the pod by the door. With the operations described above, the inside of the pod is communicated with the inside of the processing apparatus through the mini-environment. Subsequently, wafer transfer operation is repeated. A system including the mount base, the door, the first opening, a door opening/closing mechanism, a wall which is a part of the mini-environment including the first opening, and the like is generally called a front-opening interface mechanical standard (FIMS) system.

In ordinary cases, the inside of the pod with a wafer or the like loaded therein is filled with dry nitrogen or the like which is controlled to be highly clean to prevent the entry of contaminants, oxidizing gas, and the like into the pod. However, when a wafer in the pod is introduced into various kinds of processing apparatus to be subjected to predetermined processing, the inside of the pod and the inside of the processing apparatus are always kept communicating with each other. A fan and a filter are located above a chamber where the transfer robot is located such that clean air with controlled particles and the like is introduced into the chamber. However, when such the air enters the pod, there is a fear that the surface of the wafer may be oxidized by oxygen or moisture in the air.

As semiconductor devices get smaller and achieve higher performance, more attention is being paid to oxidation due to oxygen and the like that enters the pod, which has conventionally not been such a big problem. Such oxidizing gas forms a very thin oxide film on the surface of the wafer or on various kinds of layers formed on the wafer. There is a possibility that, due to such the oxide film, desired characteristics of the micro devices can not be secured. Measures against this include control of the entry of gas without the partial pressure of oxygen and the like therein being controlled from the outside of the pod into the pod. To be more specific, Japanese Patent Application Laid-open No. H11-145245 discloses a structure in which a region in a FIMS system adjacent to a pod opening is provided with a supply nozzle and a suction nozzle for gas to form an airflow curtain for substantially closing the pod opening. By forming the airflow curtain, the entry of external gas into the pod is prevented.

In semiconductor manufacturing equipment, there are some cases where a process using gas which contaminates various kinds of wiring and the like formed on the wafer such as an etching process is conducted in processing apparatus. A method of controlling the entry of the gas from the inside of the processing apparatus into the pod in this case is disclosed in Japanese Patent Application Laid-open No. 2003-007799. This method also forms an airflow curtain in front of a pod opening in a FIMS system using a fan to prevent the entry of the gas from the processing apparatus into the pod. This method is considered to be effective also in controlling inflow of oxygen into the pod as a matter of course.

SUMMARY OF THE INVENTION

However, when those methods were put to practical use, it was actually confirmed that, immediately after the pod opening was opened, the partial pressure of oxygen in the pod remarkably increased. Therefore, in order to meet the above-mentioned requirement, it is necessary to further improve those methods. The present invention is made in view of the above-mentioned situation, and an object of the present invention is to provide a lid opening/closing system of a pod as an airtight container which makes it possible to control the partial pressure of oxidizing gas such as oxygen in the pod at a predetermined low level even after the pod is opened.

To solve the above-mentioned problems, according to the present invention, there is provided a lid opening/closing system for inserting and removing an object to be contained by removing a lid from a storage container to open an opening of the storage container which comprises a substantially box-like main body capable of containing therein the object to be contained and having the opening in one surface thereof, and a lid capable of being separated from the main body for closing the opening to form airtight space together with the main body. The lid opening/closing system comprises:

a mount base on which the storage container is mounted;

a substantially rectangular opening portion adjacent to the mount base and facing the opening;

a door capable of holding the lid and capable of closing the opening portion, the door connecting the opening and the opening portion by opening the opening portion while holding the lid;

a curtain nozzle located outside a first side that is one of sides of the substantially rectangular opening portion on the side opposite to the side where the mount base is located with respect to the opening portion and capable of ejecting inert gas substantially linearly toward a second side opposite to said first side; and a cover which covers at least a part of said curtain nozzle so as to prevent gas around said curtain nozzle from being involved into the inert gas flow ejected from said curtain nozzle.

It should be noted that the above-mentioned cover defines a space around a nozzle opening of the curtain nozzle that ejects the inert gas and the cover is open toward a direction of ejection of the inert gas by said curtain nozzle. Further, it is preferable that the above-mentioned cover further includes a pair of plate-like members which are located outside of sides of the substantially rectangular opening portion other than the first and second sides thereof and which define a space of region of the gas flow ejected from the curtain nozzle in the side opposite to the side where the mount base is located with respect to the opening portion. Further, it is preferable that, the above-mentioned lid opening/closing system further includes an inert gas supply nozzle which is located on inner side of the storage container than the curtain nozzle and which is adapted to eject inert gas toward the inside of the storage container without having any component of gas flow directing toward the inert gas flow ejected from said curtain nozzle. Further, it is preferable that the above-mentioned lid opening/closing system further includes an inert gas supply nozzle composed of a pair of tubular nozzles which are located in parallel with sides of the substantially rectangular opening portion other than the first and second sides thereof and which have nozzle openings capable of ejecting inert gas directing toward the inside of the storage container.

According to the present invention, a gas curtain formed by inert gas flow is formed adjacent to a pod opening so as to close the opening, and inert gas is supplied to the inside of the pod. The supply of inert gas to the inside of the pod is carried out in a predetermined direction so as not to affect the gas curtain. To be more specific, the gas curtain controls the entry of gas from the outside of the pod into the pod, and, at the same time, inert gas is supplied to the inside of the pod, to maintain the concentration of inert gas in the pod at a constant level. By combining those effects, even when the pod is open, the partial pressure of oxidizing gas in the pod is always maintained at a predetermined low level. Further, by combining those effects, compared with a case where the entry of oxidizing gas into a pod is prevented by simply supplying inert gas to the inside of the pod and thus a large amount of inert gas is necessary, comparable or better effect of maintaining the partial pressure of oxidizing gas at a low level can be obtained with an extremely small amount of inert gas.

Further, according to the present invention, the concentration of inert gas in the inert gas flow which forms the gas curtain itself can be maintained at a high level. For example, it is known that, when gas is ejected from a nozzle, the gas involves other gas existing close to a nozzle opening and the gas mixture forms gas flow. To be more specific, because the gas forming the gas curtain involves other gas existing close to the nozzle, the concentration of inert gas forming the gas curtain decreases, and there is a fear that oxidizing gas is supplied from the gas curtain to the inside of the pod. According to the present invention, the nozzle opening is covered with the nozzle cover such that gas existing close to the nozzle opening contains a high concentration of inert gas. Therefore, even if such inert gas is involved, oxidizing gas is not involved in the gas curtain, and the entry of oxidizing gas into the pod can be effectively controlled.

BRIEF DESCRIPTION OF THE DRAWINGS

FIG. 5 is a side view illustrating a schematic structure of ordinary semiconductor wafer processing apparatus as a whole to which the present invention is applied.

FIG. 9A is a sectional view illustrating a schematic structure of part of a lid opening/closing system, that is, a load port, a pod, a lid for the pod, and an opener, according to a further embodiment mode of the present invention in a state opf the vertical section.

FIG. 9B illustrates a load port opening portion 10 shown in FIG. 9A seen from a direction of the arrow 9B.

FIG. 10A is a sectional view illustrating a schematic structure of part of a lid opening/closing system, that is, a load port, a pod, a lid for the pod, and an opener, according to a further embodiment mode of the present invention in a state of the vertical section.

FIG. 10B illustrates a load port opening portion 10 shown in FIG. 10A seen from a direction of the arrow 10B.

DETAILED DESCRIPTION OF THE PREFERRED EMBODIMENT

Figure 1A:
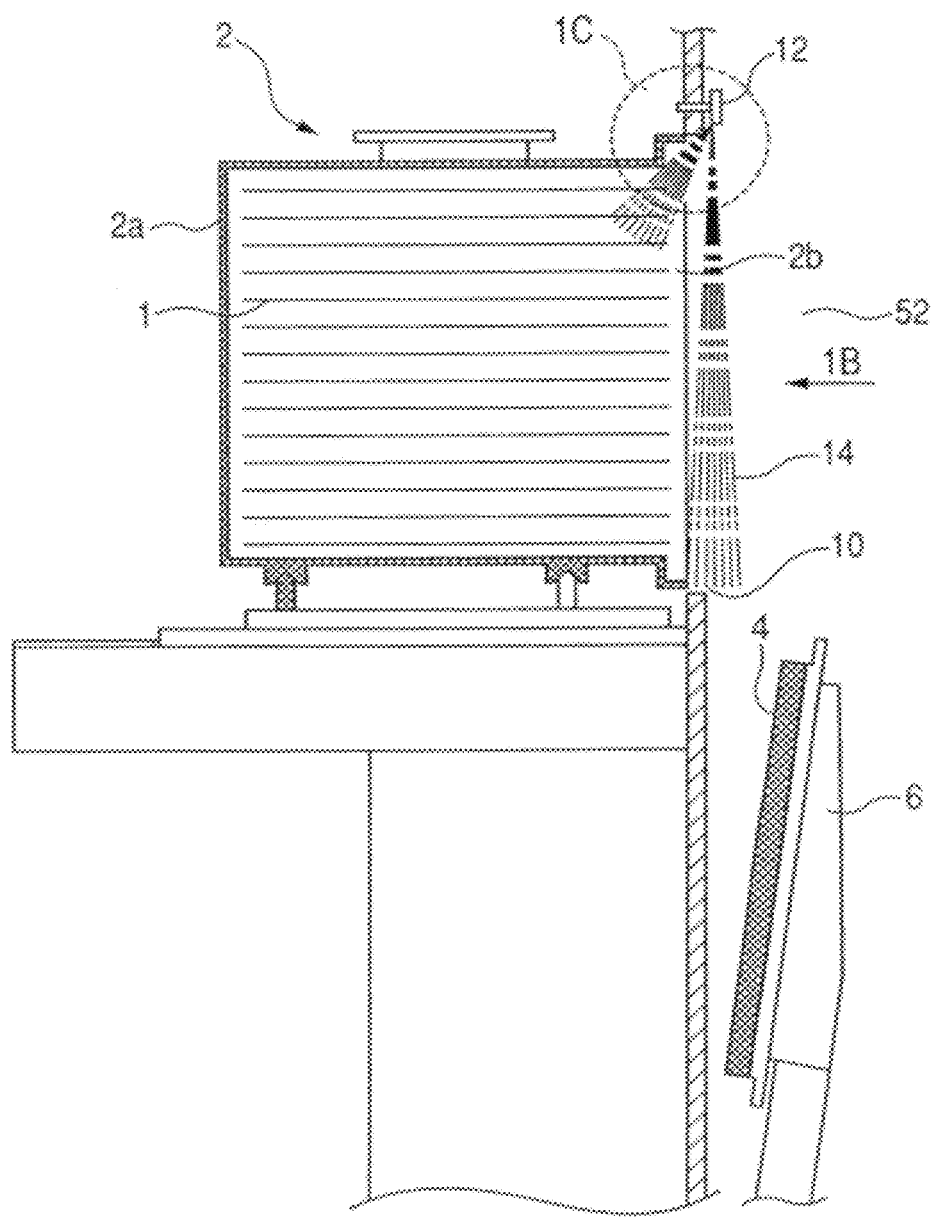
FIG. 1A is a schematic structural view of a lid opening/closing system, in other words, a load port, a pod, a lid of the pod, and a part of an opener according to a first embodiment mode of the present invention shown in a state of vertical section.

Hereinafter, embodiments of the present invention will be described with reference to the drawings. FIG. 1 is a schematic structural view of a main part of a lid opening/closing system (FIMS, hereinafter referred to as a load port) according to a first embodiment of the present invention, that is a side-view cross section of a pod and the main part of the load port which holds the pod with a lid thereof in an open state. Note that the pod inherently includes various elements such as a rack for supporting wafers and a seal member located between the lid of the pod and the pod. Further, various elements are attached to a door and a base for supporting the pod. However, those members are not directly associated with the present invention, so the detailed illustration and description thereof will be omitted. It should be noted that in the present invention a wafer 1 described below corresponds to an object to be contained, a pod 2 corresponds to a storage container, a main body portion 2a corresponds to a main body defined to be substantially in the shape of a box because its basic shape is a box, and an opening 2b of the pod 2 corresponds to an opening defined to be substantially in the shape of a rectangular because its basic shape is a rectangular or square. A base 53 described below corresponds to a mount base on which the storage container is mounted.

In FIG. 1A, inside a main body portion 2a of the pod 2 there is a space for storing wafers 1, each of which is an object to be processed. The main body portion 2a has a box shape and includes an opening provided in one of surfaces constituting the side surfaces of the main body. The pod 2 includes a lid 4 for closing the opening 2b of the main body portion 2a. The main body portion 2a includes therein a rack (not shown) having a plurality of shelves for stacking the wafers 1 which are horizontally held in a vertical direction. Each of the wafers 1 placed on the shelves is stored in the inside of the pod 2 at predetermined intervals. The opening side of the pod 2 is adapted to face and communicate with a load port opening portion 10 which is provided on the load port portion side of a transfer chamber of the load port, which will be described below. The lid 4 is adapted to be held by a port door 6 which normally closes the opening portion 10, and the lid 4 is caused to be moved by a drive mechanism (not shown) so that the opening of the pod 2 communicates with the transfer chamber 52 (shown as an open space).

Figure 1B:
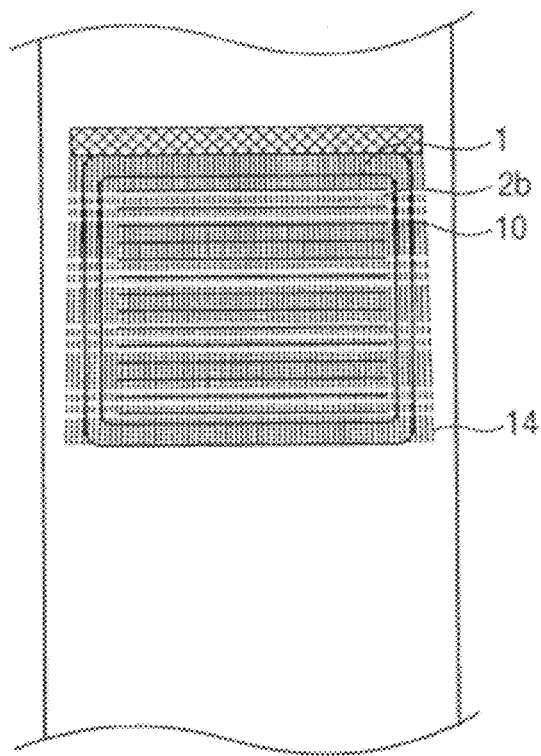
FIG. 1B is a view of a load port opening portion 10 shown in FIG. 1A seen from a direction of the arrow 1B.
Figure 1C:
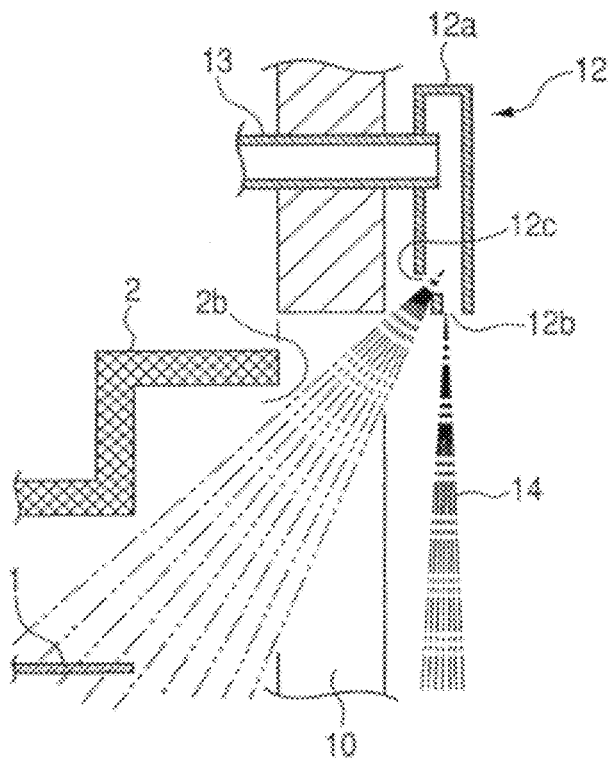
FIG. 1C is an enlarged view of a region surrounded by a dotted line 1C shown in FIG. 1A of a curtain nozzle 12 and its adjacent structure.

FIG. 1B illustrates a schematic structure of a load port opening portion 10 seen from the direction of the arrow 1B of FIG. 1A. FIG. 1C is an enlarged view of a region surrounded by a dotted line indicated by 1C shown in FIG. 1A. A curtain nozzle 12 is attached to an inner wall of a transfer chamber 52 above the load port opening portion 10. The curtain nozzle 12 has a nozzle main body 12a, a first nozzle opening 12b, and a second nozzle opening 12c. As illustrated in FIG. 1B, the nozzle main body 12a is formed of substantially a hollow pipe-like member which extends in one direction (the direction perpendicular to the plane of FIGS. 1A and 1C) and which has a length longer than the width of the load port opening portion 10. The inside of the hollow nozzle main body 12a is connected to a substantially pipe-like gas introduction path 13 for introducing inert gas or the like from an outside region to the inside. One end of the gas introduction path 13 is, as illustrated in the figure, connected to the nozzle main body 12a, while the other end of the gas introduction path 13 is connected to an inert gas introduction system (not shown). The inert gas introduction system can supply inert gas of a predetermined flow rate from a gas supply under a predetermined pressure to the gas introduction path 13.

A first nozzle opening 12b for forming inert gas flow in a direction parallel to an opening surface of the pod opening 2b is formed in a lower region of the nozzle main body 12a. The first nozzle opening 12b is a slit-like opening which extends in the direction in which the nozzle main body 12a extends, and has a length longer than the width of the load port opening portion 10. Therefore, as illustrated in FIG. 1B, the inert gas flow ejected from the first nozzle opening 12b forms a gas curtain 14 which covers the whole load port opening portion 10. The pressure and amount of the inert gas which is supplied from a gas supply system (not shown) through the gas introduction path 13 to the nozzle main body 12a are adjusted so as to be adequate for forming the gas curtain 14 which sufficiently closes the load port opening portion 10.

The nozzle main body 12a further has the second nozzle opening 12c formed therein. The second nozzle opening 12c is formed in a lower region of the nozzle main body 12a such an angle that the direction of the inert gas flow ejected from the second opening 12c is directed toward the inside of the pod through the load port opening portion 10 and the pod opening. In other words, the second nozzle opening 12c is formed such that the opening is directed toward an end portion of the wafer 1 contained in the pod 2 on the side of the pod opening 2b. Therefore, the inert gas flow ejected from the second nozzle opening 12c is ejected toward inner space of the pod 2. In this way, a state under positive pressure is formed in the pod 2 which is substantially spatially closed by the gas curtain 14 with respect to the outside of the pod space.

By a synergistic effect of the first nozzle opening 12b and the second nozzle opening 12c described above, that is, by a synergistic effect of preventing by the gas curtain 14 the entry of external air or gas into the pod and of preventing by making a pressure of inside of the pod positive the entry of external air or gas into the pod, the entry of oxidizing gas into the pod can be effectively suppressed. It should be noted that, although, in this embodiment, the respective nozzle openings are formed so as to be slit-like, dot-like openings may be additionally provided on a predetermined line at predetermined intervals. Further, although, in this embodiment, the first nozzle opening 12b and the second nozzle opening 12c are formed in the single nozzle main body 12a, taking into consideration the pressure and flow rate of inert gas to be supplied, they may be formed in main body portions, respectively, which are independent of and separated from each other. Further, in this case, a plurality of nozzle openings may be provided in the nozzle main body for supplying inert gas to the inside of the pod such that the plurality of nozzle openings are generally directed toward the inside of the pod but specific directions of the nozzle openings may be different from one another. Alternatively, the nozzle main body may be rotatable about an axis along which the nozzle main body extends, so that inert gas can be directed from the nozzle opening via all the region of the pod opening into the inside of the pod.

It should be noted that, in this embodiment, there is a matter to which attention should be paid when inert gas is supplied to the inside of the pod. To be more specific, it is indispensable that the direction of supply of inert gas is set so as not to have a component of gas flow directing toward the inert gas flow forming the gas curtain 14. The gas curtain is formed by mere gas flow. If the direction of supply of other gas has a component opposed to that flow, there is a fear that formation of the gas curtain may be hindered, airflow may be disturbed, and the entry of external gas into the pod may happen. For example, a structure in which so-called purge gas is supplied from a lower surface of the pod to the inside of the pod is known. When the gas curtain according to this embodiment is directly applied to the structure without any modification, the direction of ejection of the purge gas has a component opposed to the gas curtain. Therefore, it is necessary that at least the component opposed to the gas curtain is substantially removed from the direction of ejection of the purge gas. For example, by locating a purge gas outlet far from the pod opening toward the back of the pod, almost all the gas ejected from the outlet strikes a wafer immediately above and most of the gas flow is in the direction of planes in which the wafers extend. If the purge gas outlet is located in this way, the gas curtain can be suitably formed.

Figure 2:
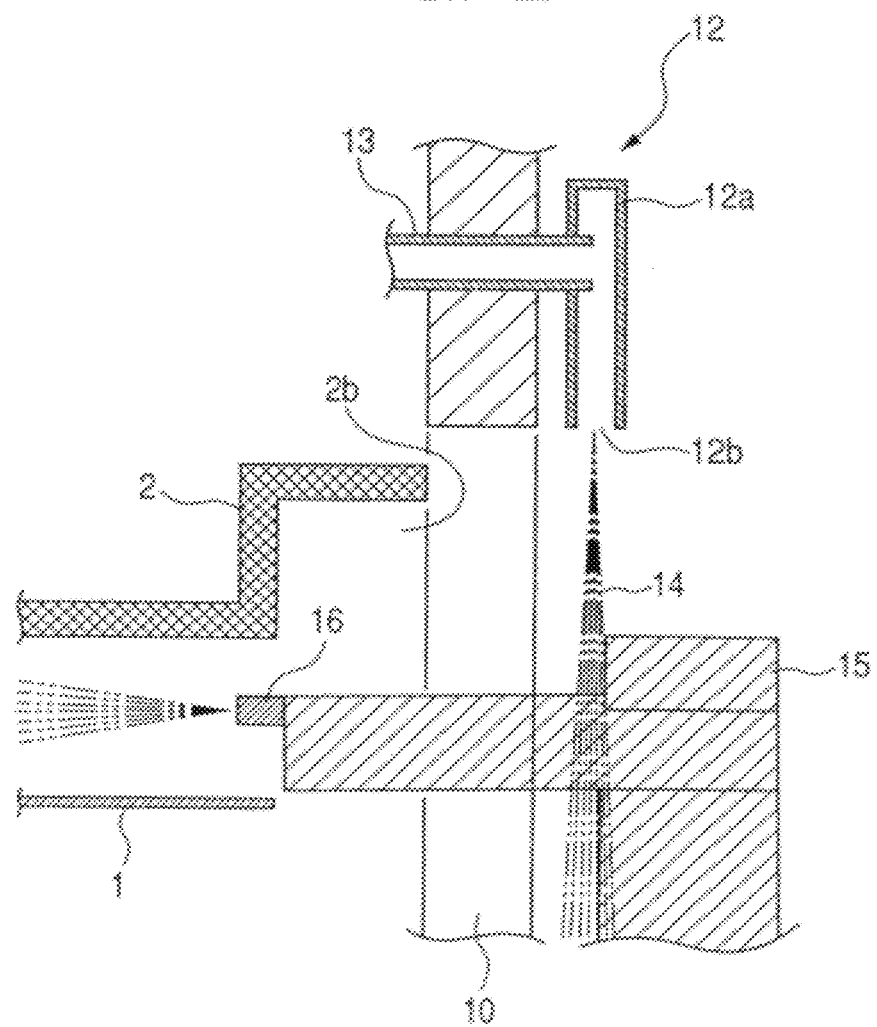
FIG. 2 illustrates a modification of the lid opening/closing system according to the first embodiment.

As a modification of this embodiment, a case where the second nozzle opening is located as an inert gas supply system which is a separate system is now described. FIG. 2 shows an enlarged view of a gas supply nozzle according to this embodiment in the same view as FIG. 1C. In a FIMS system, a so-called mapping sensor is located for deciding which shelf in the pod has a wafer. The mapping sensor is formed of for example, a pair of sensors for emitting light and receiving light located in parallel with the planes in which the wafers extend. In actual detecting operation, these sensors are adapted to move so as to sandwich wafers therebetween so that presence or absence of a wafer is detected by detecting whether light from a sensor is blocked by a wafer or not. To be more specific, the sensors for emitting light and receiving light are adapted to be introduced into the pod and are driven in a direction of arrangement of the wafers. By attaching to these sensors a nozzle 16 for supplying inert gas, inert gas can be supplied to the inside of the pod.

However, when the gas curtain 14 is formed in a state in which the sensors are positioned in an area where a wafer exists, there is a possibility that the gas curtain 14 is blocked by the mapping sensor 15. In this case, because airflow forming the gas curtain 14 is disturbed, there is a possibility that external gas which fundamentally should not enter the pod might be mixed into the pod due to the disturbance of the airflow of the gas curtain. Therefore, in the structure, it is preferable to form the gas curtain 14 in such configuration where, even if the gas curtain 14 strikes the mapping sensor 15 and airflow is disturbed, there is little adverse influence, that is, in a state where the respective sensors of the mapping sensor 15 are positioned at the lowermost end position of the pod. With the structure, inert gas supplied from the mapping sensor 15 side has little influence on the gas curtain 14, and, the influence of the existence of the mapping sensor itself on the gas curtain can be made as small as possible. Therefore, the above-mentioned effect of shielding the space with the gas curtain and effect of blocking, by supplying inert gas, the entry of external gas can be preferably obtained.

Figure 8B:
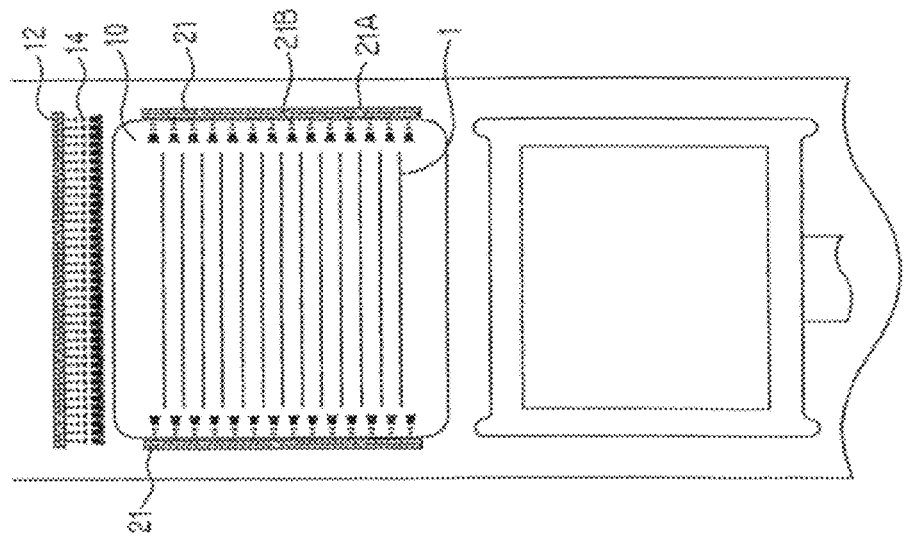
FIG. 8B illustrates a load port opening portion 10 shown in FIG. 8A seen from a direction of the arrow 8B.
Figure 8A:
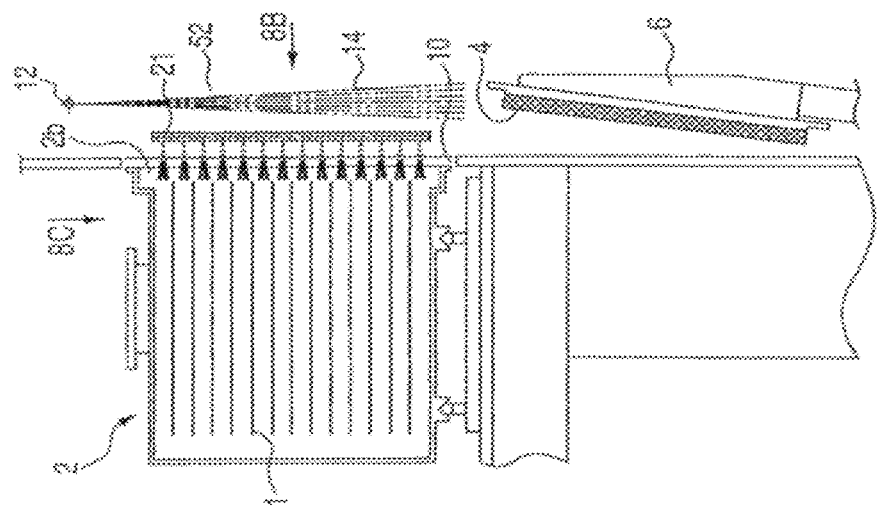
FIG. 8A is a sectional view illustrating a schematic structure of part of a lid opening/closing system, that is, a load port, a pod, a lid for the pod, and an opener, according to a further embodiment of the present invention in a state of the vertical section.
Figure 8C:
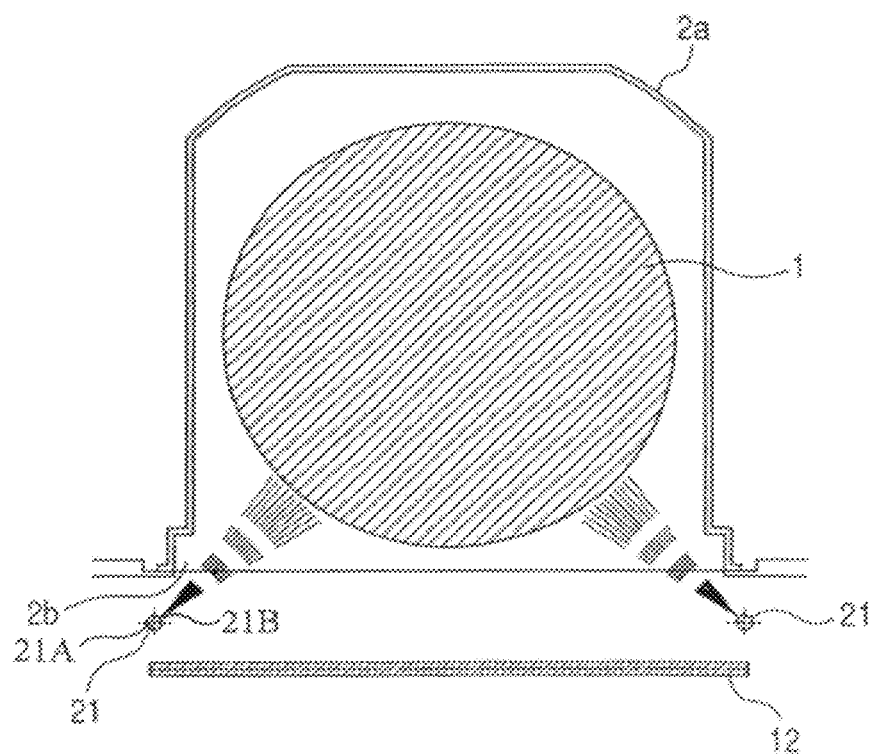
FIG. 8C illustrates a pod 2, a load port opening portion 10, and their surrounding structure shown in FIG. 8A seen from a direction of the arrow 8C.

Next, a further embodiment of the present invention is described. It should be noted that like reference numerals are used to designate structural elements of this embodiment which exhibit like or identical function, operation and effect to those of structural elements of the above-mentioned embodiment. FIG. 8A illustrates a lid opening/closing device according to this embodiment in the same view as FIG. 1A. FIG. 8B illustrates a schematic structure of the load port opening portion 10 in the device seen from the direction of the arrow 8B in FIG. 8A. FIG. 8C illustrates a wafer and a plane in which the wafer extends, seen from the direction of the arrow 8C in FIG. 8A. In this embodiment also, the curtain nozzle 12 for forming the gas curtain 14 and the nozzle for forming inert gas flow toward the inside of the pod are separately provided, that is, the inert gas supply system having the second nozzle opening is provided separately from the gas curtain nozzle 12. In this embodiment, as a structure having the second nozzle opening, a pair of purge nozzles 21 are provided.

The purge nozzles 21 have tubular purge nozzle main bodies 21a extending in one direction and are connected to a purge gas supply system (not shown). The purge nozzle main bodies 21a are located in a pair adjacent to the outside of the load port opening portion 10 on both sides thereof on the side opposite to the side of the mount base where the pod 2 is mounted with respect to the load port opening portion 10 so as to extend in parallel with the two sides of the opening portion 10. A plurality of purge nozzle openings 21b are provided in the purge nozzle main bodies 21a at predetermined intervals in the direction in which the purge nozzle main bodies 21a extend such that the intervals equal to intervals at which the wafers 1 are positioned in the pod 2 and such that the purge nozzle openings 21b are aligned to intervals between the respective wafers 1. Further, the purge nozzle openings 21b are so formed as to be directed toward the center of the wafers 1.

The present embodiment includes major design modification on that two inert gas supply systems, one of which is for the curtain nozzle 12 and the other of which is for the purge nozzles 21 are required and the plurality of tubular members have to be located around the load port opening portion 10. However, this embodiment makes it possible to obtain the effect of the gas curtain, and at the same time, purge gas can be supplied evenly to surfaces of the respective wafers 1. Further, inert gas can be supplied to the whole region inside the pod 2 with the least resistance and without disturbing gas flow when the inert gas is supplied. Therefore, when atmosphere enters the pod 2 by opening and closing the lid, further entry of atmosphere into the pod 2 can be suppressed by the gas curtain while the partial pressure of atmosphere (oxygen) in the pod can be promptly and effectively decreased by inert purge gas.

It should be noted that, in this embodiment, tubular members located in parallel with the arrangement direction of the wafers in the pod 2, that is, in parallel with two sides other than one side where the curtain nozzle 12 is located and a side opposed to the one side of the load port opening portion 10 are used as the purge nozzles 21. Further, the plurality of nozzle openings in the purge nozzles 21 are provided at predetermined intervals in the direction in which the tubular members extend and eject inert gas toward predetermined directions, respectively. However, location of the nozzle openings is not limited thereto, and, as far as substantially linear inert gas flow can be formed along a predetermined direction such as a direction in parallel with the sides, the location and shape of the nozzle openings and the shape of the purge nozzles are not limited to the ones described in this embodiment.

Figure 3:
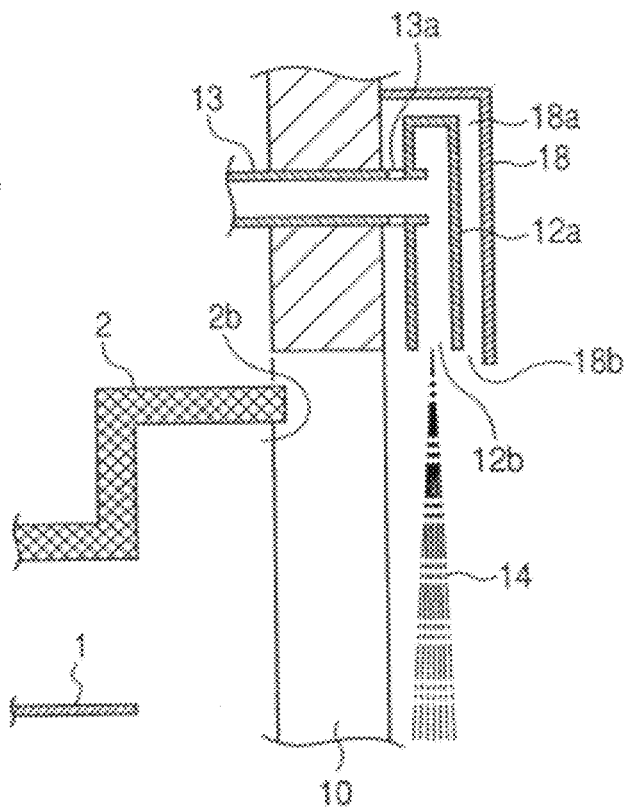
FIG. 3 is an enlarged view of a main portion of a lid opening/closing system according to a second embodiment of the present invention.

Next, a main portion of a lid opening/closing device according to the second embodiment of the present invention is described in the following with reference to FIG. 3 illustrating a gas curtain nozzle in the same view as FIG. 1C. It should be noted that, with regard to a structure which exhibit substantially like function, operation and effect to those of the structure illustrated in FIG. 1C, like reference numerals are used in the following description. Further, because the curtain nozzle 12 in this embodiment has a structure similar to that of the curtain nozzle 12 described in the first embodiment except that it does not have the second nozzle opening 12c, the description thereof is omitted here. In this embodiment, the curtain nozzle 12 is covered with a nozzle cover 18 so formed as to cover the nozzle main body 12a. The nozzle cover 18 has inner space 18a which can accommodate the curtain nozzle 12 and is formed of a member forming an inner shape substantially similar to the curtain nozzle 12.

The nozzle cover 18 further has a cover opening 18b provided in its lower region. The curtain nozzle 12 is located in the inner space 18a of the nozzle cover 18, and the first nozzle opening 12b and the cover opening 18b are located so as to be aligned with each other with regard to the direction of formation of the gas curtain 14. Here, the positional relationship between the nozzle cover 18 and the curtain nozzle 12 is set such that the first nozzle opening 12b is contained in the inner space 18a of the nozzle cover 18.

Further, in this embodiment, a communication opening 13a which communicates with the inner space 18a of the nozzle cover 18 is provided in the gas introduction path 13. By providing the communication opening 13a, this embodiment makes it possible to introduce inert gas into the inside of the nozzle cover 18 and into the curtain nozzle 12 through a single gas introduction system. It should be noted that ejection of inert gas from the inner space 18a is basically not necessary, and all what is necessary is that space around the first nozzle opening 12b is filled with inert gas. Therefore, the amount of inert gas which is made to flow from the communication opening 13a into the inner space 18a is sufficient if the inert gas fills the space covered with the nozzle cover 18.

It should be noted that, in this embodiment, the inner surface of a wall where the load port opening portion 10 is formed is used for forming a part of the nozzle cover 18, and the nozzle cover 18 is shown as a member formed of two surfaces, one of which is an upper surface portion and the other of which is a side surface portion connected to an end of the upper surface portion. However, the nozzle cover 18 may be formed as a substantially pipe-like member similarly to the curtain nozzle main body 12a. Further, the nozzle cover 18 does not necessarily have to cover the whole curtain nozzle, and may cover only the space around the first nozzle opening 12b. Still further, a path for supplying inert gas to the nozzle cover inner space 18a may be provided separately from the gas introduction path 13. Therefore, the nozzle cover may have various shapes and structures as far as the nozzle cover has a shape which defines some extent of space around the nozzle opening of the curtain nozzle so as to prevent gas around the nozzle opening of the curtain nozzle from being involved into the inert gas flow ejected from the nozzle opening of the curtain nozzle and which has an open region corresponding to the flow path of inert gas ejected from the nozzle opening of the curtain nozzle for forming the gas curtain.

In the lid opening/closing device according to this embodiment, the curtain nozzle 12 for forming the gas curtain 14 is covered with the nozzle cover such that even gas existing close to the first nozzle opening 12b contains a high concentration of inert gas. Therefore, even if such inert gas is involved into the gas flow forming the gas curtain, oxidizing gas is not involved in the gas curtain 14, and the entry of oxidizing gas into the pod can be effectively suppressed.

Figure 4:
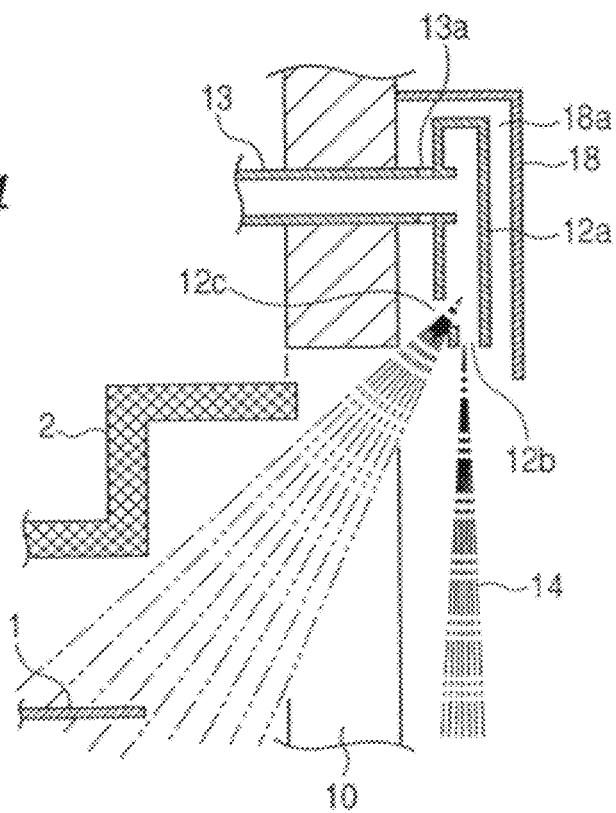
FIG. 4 is an enlarged view of a main portion of a lid opening/closing system according to a third embodiment of the present invention.

Next, a third embodiment of the present invention is described with reference to FIG. 4. FIG. 4 illustrates a main portion of a lid opening/closing device according to a third embodiment of the present invention in the same view as FIG. 1C or FIG. 3. An object of this embodiment is to obtain two effects: to introduce inert gas into the pod by the second nozzle opening 12c used in the first embodiment; and to prevent oxidizing gas from being mixed into the gas curtain by the nozzle cover used in the second embodiment. To be more specific, the nozzle cover 18 illustrated in FIG. 3 is added to the curtain nozzle 12 illustrated in FIG. 1C.

It should be noted that, because the specific structure of the curtain nozzle 12 and the specific structure of the nozzle cover 18 are substantially identical to those described above in the first and second embodiments, detailed description of the respective structures is omitted here. In this embodiment, space around the second nozzle opening 12c is also covered with inert gas by using the nozzle cover 18. As a result, high purity can be maintained also with regard to inert gas introduced into the pod. Therefore, not only the above-mentioned effect of shielding the space with the gas curtain, effect of blocking, by supplying inert gas, the entry of external gas, and effect of preventing the mixing of oxidizing gas into the gas curtain can be obtained but also high purity can be maintained with regard to gas introduced into the pod.

It should be noted that, in this embodiment described above, the curtain nozzle is located above the opening portion. However, the embodiment of the present invention is not limited thereto. In view of efficiently transferring an object to be contained such as a wafer, the pod opening and the opening portion are substantially in the shape of a rectangular with its corners rounded. The curtain nozzle is located outside the rectangular shape along one side of the rectangular. As far as inert gas is ejected toward a side opposed to said one side of the rectangular, the curtain nozzle may be located along whichever side of the rectangular. The nozzle opening may be slit-like, dot-like, or a combination thereof as far as the inert gas flow is approximately continuous in a section perpendicular to the direction of ejection and substantially forms a curtain, in other words, substantially linear. Further, it is preferable that inert gas is introduced into the pod always in a direction toward the inside of the pod (toward the center of the pod or toward a surface opposed to a surface having the opening formed therein). Therefore, it is preferable that the gas outlet is located adjacent to a side along which the curtain nozzle is located and closer to the inside of the pod than the curtain nozzle is.

Figure 9C:
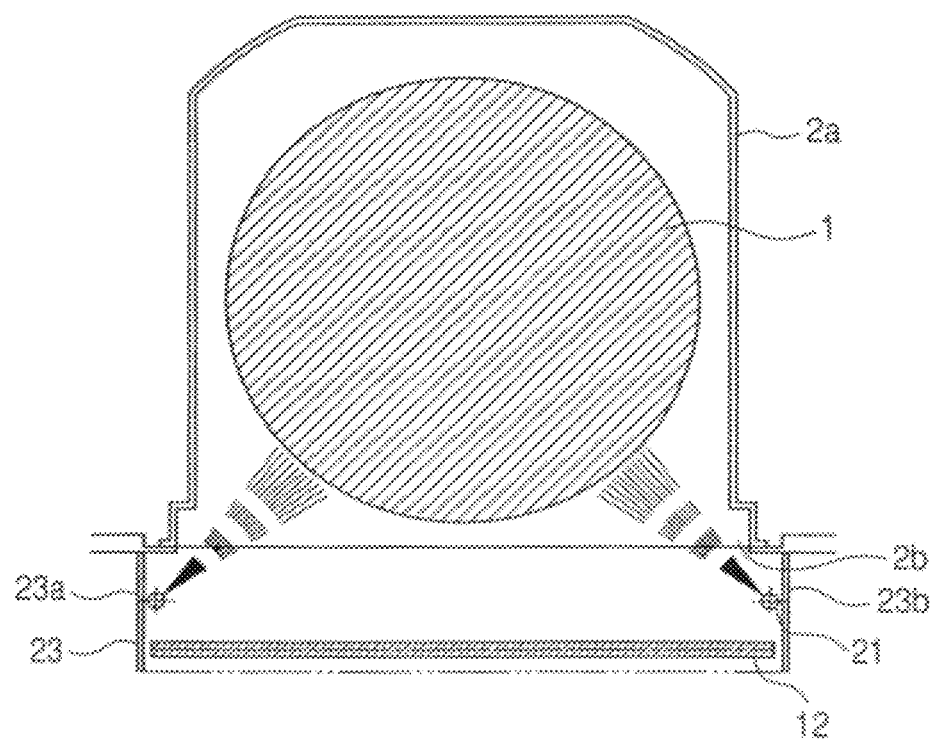
FIG. 9C illustrates a pod 2, a load port opening portion 10, and their surrounding structure shown in FIG. 9A seen from a direction of the arrow 9C.

Here, the nozzle cover in the embodiment described above is provided around the curtain nozzle or the like with the intention of preventing involvement of environmental atmosphere in gas flow forming the gas curtain when the gas curtain is formed. However, the form of the cover is not limited to a nozzle cover, and, for example, a nozzle cover of a type which prevents diffusion of gas flow in the gas curtain may be provided to prevent gas atmosphere from flowing toward the inside of the pod by the gas curtain. A structure with a nozzle cover of this type is described in the following as a further embodiment of the present invention. It should be noted that, in explaining this embodiment, like reference numerals are used to designate structural elements of this embodiment which exhibit like or identical function, operation and effect to those of structural elements of the above-mentioned embodiment, and detailed description thereof is omitted. FIGS. 9A, 9B, and 9C illustrate a lid opening/closing device according to this embodiment in the same view as FIGS. 8A, 8B, and 8C described above.

In this embodiment, in addition to the curtain nozzle 12 and the purge nozzles 21 illustrated in FIG. 8A and the like, a cover 23 is located around the load port opening portion 10. The cover 23 is formed of three plate-like members 23a, 23b, and 23c having the same width. The plate-like members protrude from a surface of the wall where the load port opening portion 10 is formed on the side opposite to the side where the mount base is formed with respect to the load port opening portion so as to be perpendicular to the surface and so as to be in parallel with the two sides and a top side of the load port opening portion 10. The plate-like members 23a and 23b along the two sides and the plate-like member 23c along the top side are connected to one another at their ends intersecting one another to form a generally U-shaped member which is open on a lower side of the load port opening portion 10. The U-shaped member is located so as to protrude around the load port opening portion 10, and the curtain nozzle 12 and the purge nozzles 21 are housed inside the U-shape member.

According to this embodiment, the plate-like member 23c along the top side decreases or prevents involvement of oxidizing gas in the gas curtain 14 supplied from the curtain nozzle 12. In other words, the main object of the plate-like member 23c along the top side is to obtain this effect, and may be in the shape of the nozzle cover of the second embodiment. In order to obtain the effect with regard to the gas curtain, it is sufficient that the cover is configured to define a circumferential space around the region of the nozzle opening of the curtain nozzle which ejects the inert gas to form the gas curtain flow so as to prevent any oxidizing gas from being involved in the gas curtain flow. The inert gas flow ordinarily diffuses with a larger extent as being farther from the curtain nozzle 12 where concentration of the inert gas per unit volume reduces, and as a result the curtain effect degrades. In this embodiment mode, the plate-like members 23a and 23b along the two sides prevent diffusion of inert gas in the direction where these plate-like members exist, and the effect obtained by the inert gas flow can be suitably maintained to a further downstream side of the inert gas flow. Further, because the plate-like members along the two sides exist, involvement of oxidizing gas by inert gas flow when the purge nozzles 21 generates the gas flow can be decreased or prevented.

It should be noted that, in this embodiment, the plate-like members 23a and 23b along the two sides are located so as to be in parallel with the two sides of the load port opening portion 10. However, in view of preventing gas diffusion, the plate-like members may be slanted with respect to the sides of the load port opening portion 10 such that the distance from the plate-like members to the sides of the load port opening portion 10 decreases as the plate-like members approaches the bottom side of the load port opening portion. This gathers gas flow which flows between the plate-like members 23a and 23b along the sides toward the center of the opening portion as the plate-like members 23a and 23b approach the bottom side of the opening portion, and thus, even if part of the gas flow is gradually lost by diffusion, the same gas flow as that immediately after ejection can be maintained even at the bottom side of the opening portion. Further, the extending direction of the plate-like members 23a and 23b projected from the wall of the load port along the sides may be slanted with respect to the normal to the wall of the load port or a plane on which the load port opening portion is formed such that the distance between the plate-like members becomes narrower as being further away from the wall of the load port or the plane on which the opening portion is formed. The plate-like members 23a and 23b along the sides are so inclined as to be directed toward the convergent direction in the transfer chamber 52 (see FIG. 1), so that gas flow which is about to diffuse can be concentrated to the place where the opening portion is formed, and thus, the gas flow can be maintained as even flow over the whole region of the opening portion. Those slants are not always required to be provided over the whole region of the plate-like members, and may be provided over a predetermined portion. In this case, it is more preferable to provide the slants especially on a downstream side of the gas flow in the gas curtain where decrease in the concentration of inert gas is a concern.

Figure 10C:
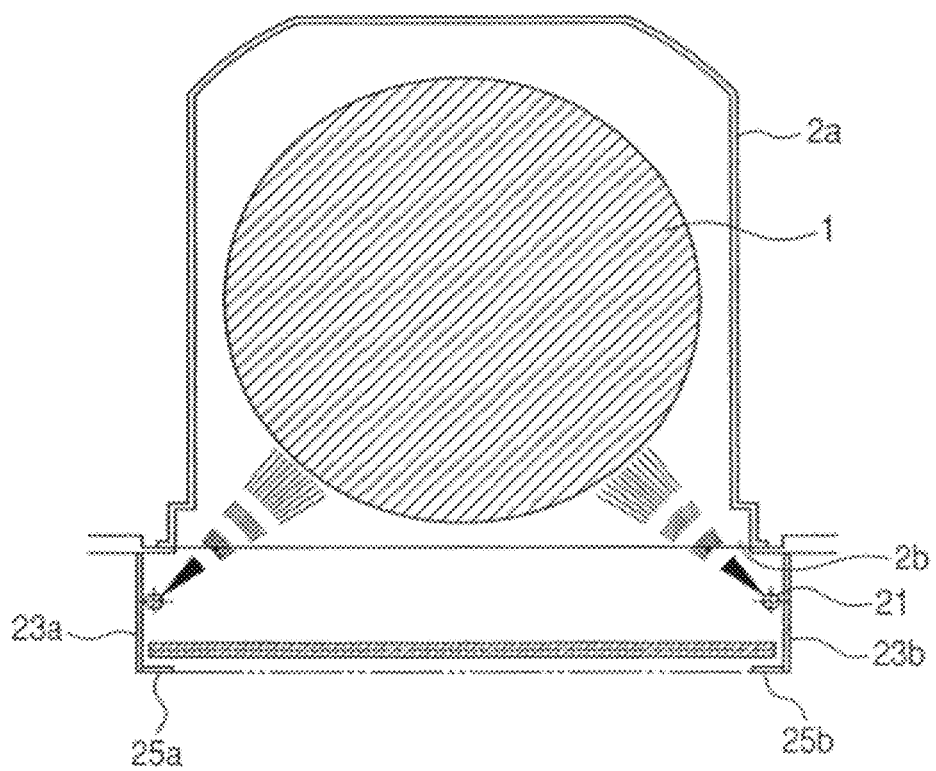
FIG. 10C illustrates a pod 2, a load port opening portion 10, and their surrounding structure shown in FIG. 10A seen from a direction of the arrow 10C.

As a further modification of this embodiment, another plate-like members may be additionally provided, which protrudes from each of the plate-like members at its end different from the end where the plate-like member is joined to the surface where the opening portion is formed and which is in parallel with the surface where the opening portion is formed, so as to protrude inwardly thereby forming a canopy-like U-shape. The present embodiment is illustrated in FIGS. 10A, 10B, and 10C in the same way as in FIGS. 9A, 9B, and 9C. In this embodiment, plate-like canopies 25a and 25b are fixed to the end of the plate-like members 23a and 23b on the sides, respectively. Because of the canopies, diffusion of inert gas in the gas curtain can be more suitably suppressed, and the gas flow can be held flowing in a region surrounded by the plate-like members. It should be noted that the width between the canopies 25a and 25b is set so as not to reduce the size of the load port opening portion 10. Further, the canopies may be fixed to the plate-like members 23a and 23b which are slanted with respect to the sides of the load port opening portion 10 as mentioned above. Further, the canopy may be provided with respect to the plate-like member 23c on the top side. To be more specific, the plate-like members on the sides may be slanted on a downstream side of the gas curtain from a predetermined position of the load port opening portion 10 such that the distance between the plate-like members on the sides decreases toward the downstream side of the gas curtain. Further, a canopy may be added also to the plate-like member 23c on the top side. Even if part of the gas flow is gradually lost, the same gas flow as that immediately after ejection can be maintained even at the bottom side of the opening portion.

Next, a FIMS system as a lid opening/closing system which implements the present invention and semiconductor wafer processing apparatus using the system are described. It should be noted that, in this embodiment, a case where the curtain nozzle 12 described in the first embodiment is used is described first. FIG. 5 illustrates a schematic structure of a semiconductor wafer processing apparatus 50 which conforms to a so-called mini-environment system. The semiconductor wafer processing apparatus 50 is mainly formed of a load port portion (a FIMS system, a lid opening/closing device) 51, the transfer chamber 52, and a processing chamber 59. A partition 55a and a cover 58a on the side of the load port and a partition 55b and a cover 58b on the side of the processing chamber are provided between the load port portion 51 and the transfer chamber 52 and between the transfer chamber 52 and the processing chamber 59, respectively. In order to remove contaminants and maintain high purity in the transfer chamber 52 of the semiconductor wafer processing apparatus 50, a fan (not shown) provided above the transfer chamber 52 generates airflow from a top portion of the transfer chamber 52 to a lower portion of the transfer chamber 52. This always lets out contaminants downward.

The pod 2 which is a storage container for storing silicon wafers or the like (hereinafter merely referred to "wafers") is mounted on the base 53 located on the load port portion 51. As described earlier, the inside of the transfer chamber 52 is maintained to high cleanliness in order to process the wafers 1. Further, the transfer chamber 52 includes a robot arm 54. The wafers are transferred between the pod 2 and the processing chamber 59 by means of the robot arm 54. The processing chamber 59 normally includes various mechanisms for performing processings, such as thin film formation and thin film processing on the surfaces of the wafers. However, the mechanisms are not directly related to the present invention, so the description will be omitted.

The pod 2 has a space for storing the wafers 1, each of which is the object to be processed, in the inside thereof. The pod 2 includes the box main body portion 2a having the opening portion provided in one of the surfaces and the lid 4 for enclosing the opening portion. The main body portion 2a includes the rack having the plurality of shelves for stacking the wafers 1 in one direction. Each of the wafers 1 placed on the shelves are stored in the inside of the pod 2 at predetermined intervals. In this embodiment, the direction in which the wafers 1 are stacked is set to the vertical direction. The opening portion 10 is provided on the load port portion 51 side of the transfer chamber 52. When the pod 2 is to be located on the load port portion 51 such that the pod 2 is close to the opening portion 10, the opening portion 10 is located to face the opening portion of the pod 2. The transfer chamber 52 includes an opener 3 (described later) provided on the inner side in the vicinity of the opening portion 10.

Figure 6A:
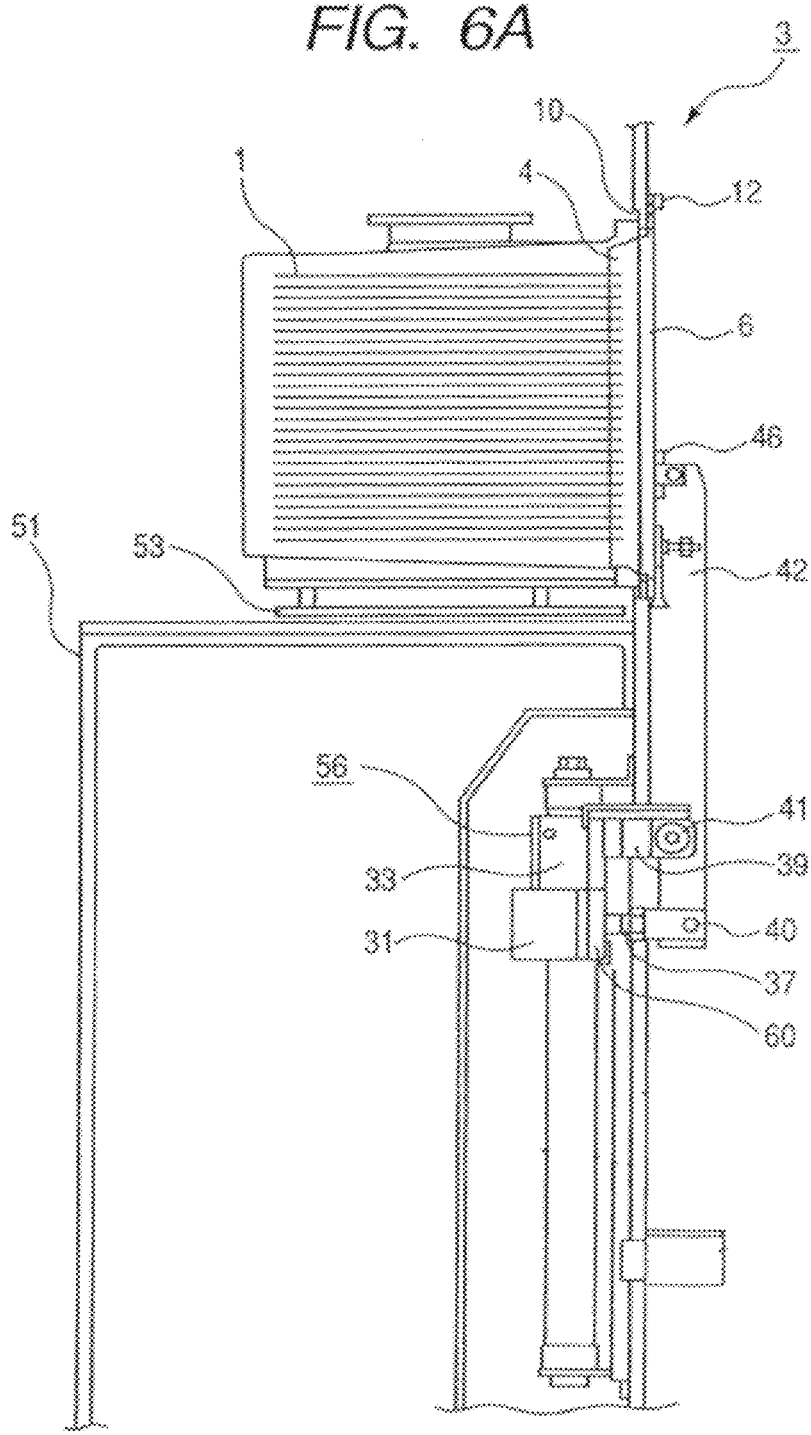
FIG. 6A is an enlarged side view illustrating a schematic structure of a conventional opener and an associated structure thereof in the apparatus shown in FIG. 5.
Figure 6B:
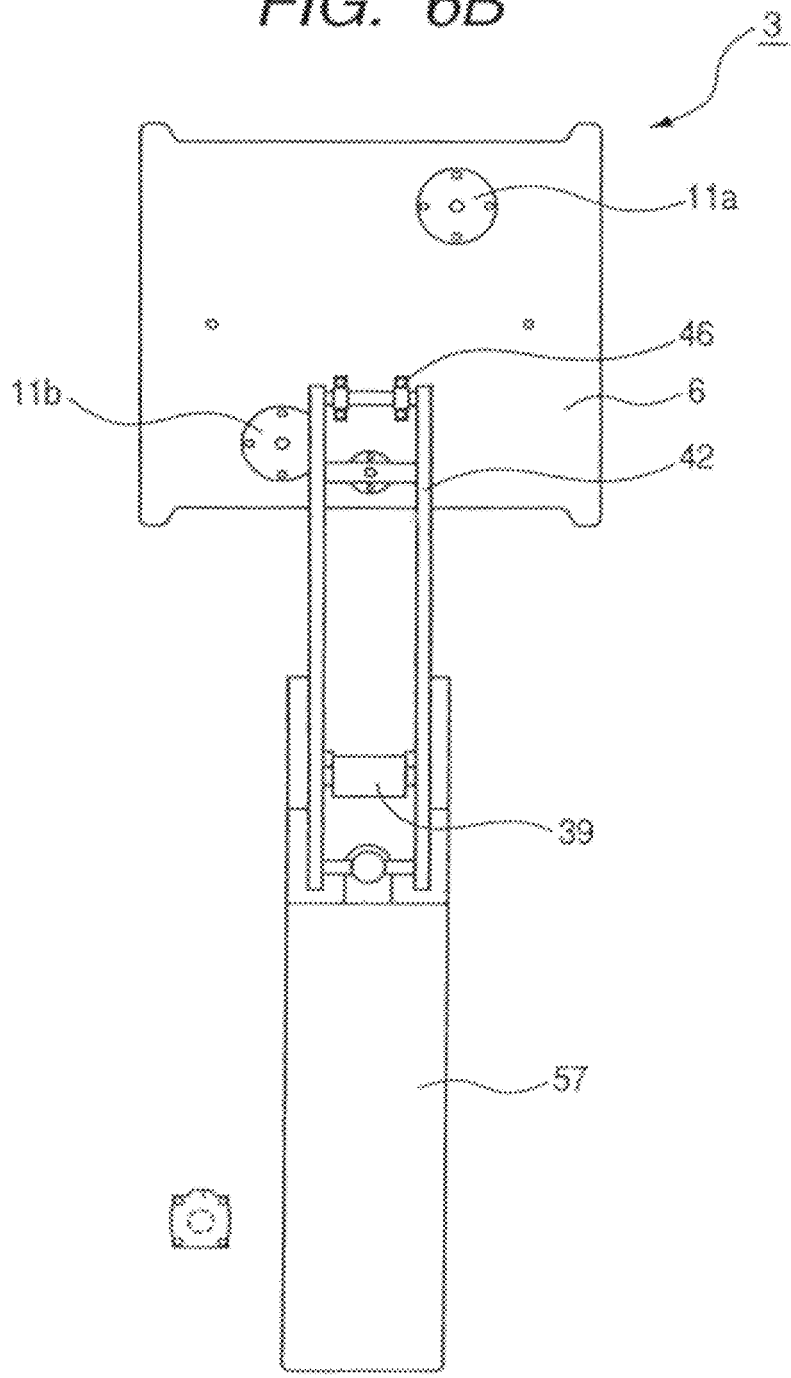
FIG. 6B illustrates a schematic structure of the structure shown in FIG. 6A seen from the transfer chamber side.
Figure 7:
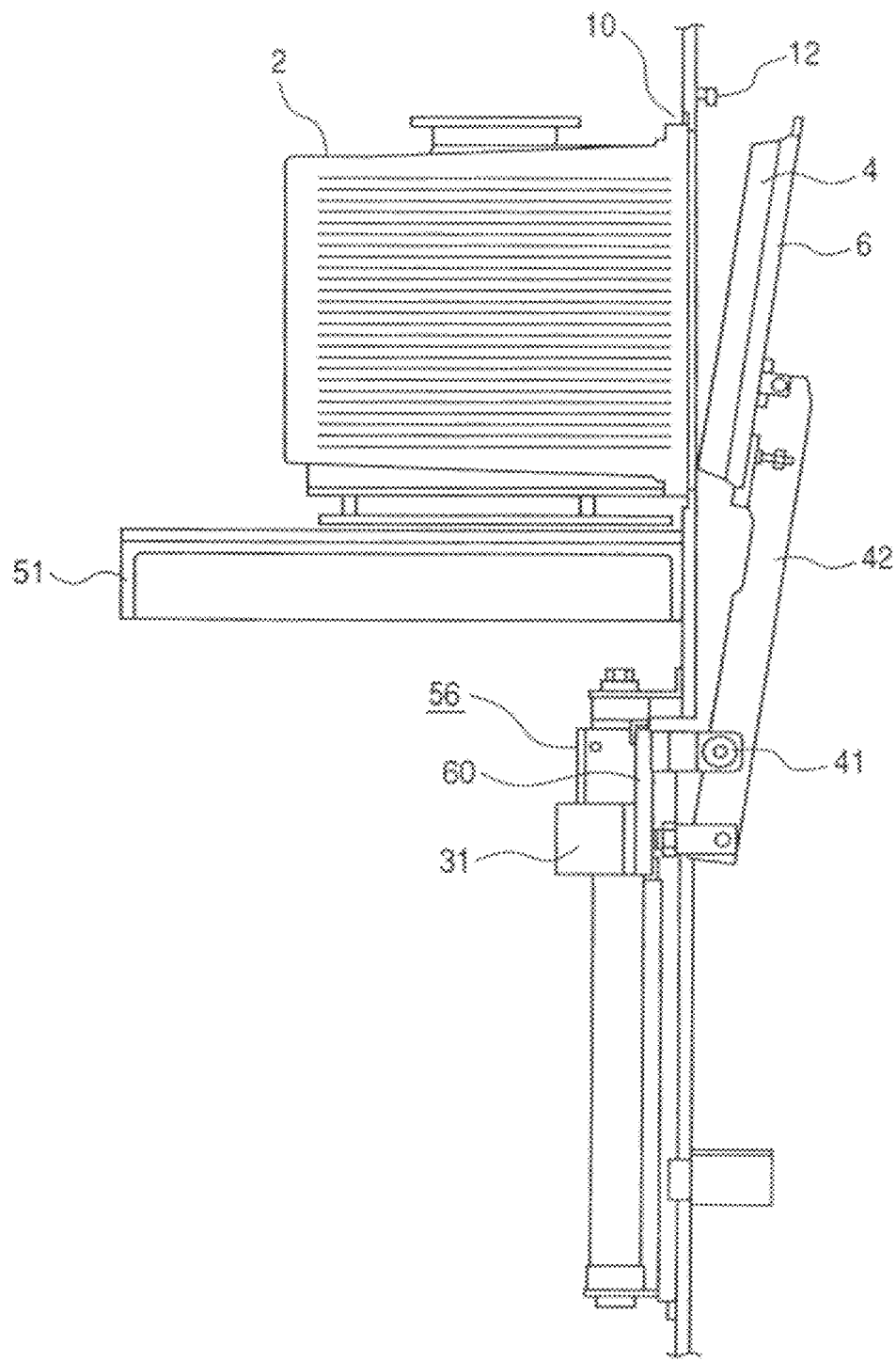
FIG. 7 is a side view illustrating a schematic structure of an opener and the like in a state ready for purging to illustrate purge operation.

FIG. 6A is an enlarged side cross sectional view showing an opener 3 in a conventional apparatus and FIG. 6B is a font view showing the opener 3 which is viewed from the transfer chamber 52 side. FIG. 7 is a schematic side cross sectional view showing a state where the lid 4 is removed from the pod 2 using the opener 3. The opener 3 includes the door 6 and a door arm 42. A fixing member 46 is installed on the door 6. The door 6 is pivotably connected to one end of the door arm 42 through the fixing member 46. The door arm 42 is supported at the other end thereof to a tip end portion of a rod 37 which is a part of air-drive cylinder 31 through a pivot axis 40 to be pivotable about the pivot axis 40.

A through hole is provided between the one end of the door arm 42 and the other end of the door arm 42. A pin (not shown) extends through the through hole and a hole of a fixed member 39 fixed to a support member 60 of a movable portion 56 for moving the opener 3 up and down, thereby forming a supporting point 41. Therefore, the door arm 42 is pivotable about the supporting point 41 according to the extension and retraction of the rod 37 due to the drive of the cylinder 31. The support point 41 of the door arm 42 is fixed to the support member 60 to which the vertically movable portion 56 is provided. The door 6 includes holding ports 11a and 11b and thus can hold the lid 4 of the pod 2 by vacuum contact.

When the wafer 1 is processed by the above-mentioned structure, first, the pod is located on the base 53 so as to be adjacent to the transfer chamber opening portion 10, and the lid 4 is held by the door 6. It should be noted that a mechanism-to-engage (not shown) is provided on a surface of the door 6 while a mechanism-to-be-engaged (not shown) is provided on a surface of the lid 4. By actuating those mechanisms with the surfaces of the lid 4 and of the door 6 in contact with each other, the lid 4 is held by the door 6. Here, when the rod of the cylinder 31 is retracted, the door arm 42 moves away from the transfer chamber opening portion 10 with the supporting point 41 being the rotation axis. According to this action, the door 6 rotates together with the lid 4 to remove the lid 4 from the pod 2, as illustrated in FIG. 7. After that, the movable portion 56 is lowered to move the lid 4 to a predetermined retreat position.

The curtain nozzle 12 according to the present invention is located in a top portion of the transfer chamber opening portion 10. After the lid 4 is removed using the port door 6, the curtain nozzle 12 forms the gas curtain 14, and, at the same time, supplies inert gas to the inside of the pod. It is preferable that, in order to avoid a large change in the internal pressure of the transfer chamber 52 and the like when clean gas is supplied, exhaust operation of various kinds such as suction exhaust of the transfer chamber be simultaneously carried out corresponding to gas supply operation.

Further, in this embodiment, the description is in the context of FOUP and FIMS, but application of the present invention is not limited thereto. As far as the container is a front-opening type container which contains a plurality of objects to be contained and is opened and closed when the objects to be contained are inserted into or removed from the container in the system, the lid opening/closing device according to the present invention can be applied to maintain the partial pressure of oxidizing atmosphere in the container at a low level. Further, when the gas which fills the container is not inert gas but predetermined gas having desired characteristics, the lid opening/closing system according to the present invention can be used to maintain the partial pressure of the predetermined gas in the container at a high level.

According to the present invention, the effect of shielding the space with the gas curtain, the effect of suppressing, by supplying inert gas, the entry of external gas, and the effect of preventing oxidizing gas from being mixed into the gas curtain can be obtained, and further, high purity can be maintained with regard to gas introduced into the pod. Further, the present invention can be implemented only by adding to an existing FIMS system a gas supply pipe and the like, which can be added to a standardized system easily at low cost.

What is claimed is:

1. A lid opening/closing system for inserting and removing an object to be contained by removing a lid from a storage container to open an opening of the storage container, the storage container comprising a main body capable of containing therein the object to be contained and having the opening in one surface thereof, and a lid capable of being separated from the main body for closing the opening to form airtight space together with the main body, the lid opening/closing system comprising:

a mount base on which the storage container is mounted;

an opening portion adjacent to the mount base and facing the opening;

a door capable of holding the lid and capable of closing the opening portion, the door connecting the opening and the opening portion by opening the opening portion while holding the lid;

a curtain nozzle located at a first area outside and along a part of a periphery of the opening portion on the side opposite to the side where the mount base is located with respect to the opening portion and capable of ejecting inert gas in a direction from the first area toward a second area opposite to the first area with respect to the opening portion; and a cover which extends relative to the curtain nozzle with respect to a wall in which the opening portion is defined, so as to cover the curtain nozzle, wherein the cover defines a space around a nozzle opening of the curtain nozzle that ejects the inert gas and the cover is open toward a direction of ejection of the inert gas by the curtain nozzle, and wherein the cover further includes a pair of plate member portions which are located along areas periphery of the opening portion, each of which is opposite to another and other than the first and second areas thereof so that the cover defines a space of region of the gas flow ejected from the curtain nozzle in the side opposite to the side where the mount base is located with respect to the opening portion.

2. A lid opening/closing system according to claim 1, wherein said cover further includes an additional pair of plate members which are located outside of third areas of the opening portion other than the first and second areas and which define a space of a region of the gas flow ejected from the curtain nozzle.

* * * * *